United States Patent [19]

Sano et al.

[11] Patent Number: 5,779,937
[45] Date of Patent: Jul. 14, 1998

[54] ORGANIC ELECTROLUMINESCENT DEVICE

[75] Inventors: Takeshi Sano, Hirakata; Yuji Hamada, Ikoma-gun; Kenichi Shibata, Hashimoto, all of Japan

[73] Assignee: Sanyo Electric Co., Ltd., Osaka-fu, Japan

[21] Appl. No.: 638,734

[22] Filed: Apr. 29, 1996

[30] Foreign Application Priority Data

May 16, 1995 [JP] Japan ..................... 7-142713
Aug. 4, 1995 [JP] Japan ..................... 7-219743

[51] Int. Cl.$^6$ ..................................... B32B 9/00
[52] U.S. Cl. ............... 252/301.16; 428/690; 313/504
[58] Field of Search .................... 428/690; 313/504; 252/301.27, 301.28, 301.31, 301.16

[56] References Cited

U.S. PATENT DOCUMENTS

| | | |
|---|---|---|
| 652,273 | 5/1900 | Shinko . |
| 5,484,922 | 1/1996 | Moore et al. ............. 313/504 |
| 5,486,406 | 1/1996 | Shi ........................ 313/504 |

FOREIGN PATENT DOCUMENTS

| | | |
|---|---|---|
| 652 273 | 5/1995 | European Pat. Off. . |
| 6-336586 | 12/1994 | Japan . |

OTHER PUBLICATIONS

Nakamura et al "A Novel Blue Light Emitting Material Prepared from 2-(o-Hydroxphenyl)benzoxazole", Chem. Lett., 1994, 1741-42. *

Chemistry Letters, pp. 1741-1742, 1994. (The Chemical Society of Japan) A Novel Blue Light Emitting Material Prepared from 2-(o-Hydroxyphenyl)benzoxazole.

*Primary Examiner*—Melissa Bonner
*Attorney, Agent, or Firm*—Armstrong, Westerman, Hattori, McLeland & Naughton

[57] ABSTRACT

In an organic electroluminescent device according to the present invention, at least a carrier transporting layer and a luminescent layer using an organic material are laminated between a hole injection electrode and an electron injection electrode, and a chelate compound, indicated by the following chemical formula, having as a ligand a heterocyclic compound is contained in at least one of the carrier transporting layer and the luminescent layer:

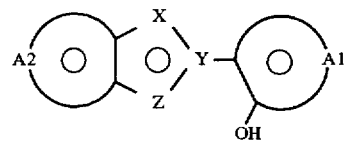

In the foregoing chemical formula, X and Z are any elements selected from C, S, Se, Te, N and P. Y is any one element selecting from C, N and P. (A1) is an aromatic radical or a heterocyclic radical in which a hydroxyl group is bound to the Y in an ortho position, and (A2) is a radical which is bound to carbon to which the X is bound and carbon to which the Z is bound to constitute an aromatic compound or a heterocyclic compound.

3 Claims, 2 Drawing Sheets

ORGANIC ELECTROLUMINESCENT DEVICE

BACKGROUND OF THE INVENTION

1. Field of the Invention

The present invention relates generally to an organic electroluminescent device in which a luminescent layer and a carrier transporting layer using an organic material are formed between a hole injection electrode and an electron injection electrode, and more particularly, to an organic electroluminescent device capable of stably emitting light having uniform and sufficient luminance because an organic material used for a luminescent layer and a carrier transporting layer is hardly crystallized.

2. Description of the Prior Art

In recent years, the needs of plane display devices, the consumed power and the volume of which are smaller than those of a CRT which has been conventionally generally employed, have been increased as information equipment is diversified, for example. An electroluminescent device (hereinafter referred to as an EL device) has been paid attention to as one of the plane display devices.

EL devices are roughly divided into inorganic EL devices and organic EL devices depending on the material used.

The inorganic EL device is so adapted that a high electric field is generally exerted on a luminescent portion, and electrons are accelerated within the high electric field to collide with a luminescence center, whereby the luminescence center is excited to emit light.

On the other hand, the organic EL device is so adapted that electrons and holes are respectively injected into a luminescent portion from an electron injection electrode and a hole injection electrode, the electrons and the holes thus injected are recombined with each other in a luminescence center to bring an organic molecule into its excited state, and the organic molecule emits fluorescence when it is returned from the excited state to its ground state.

In the inorganic EL device, a high voltage of 100 to 200 V is required as its driving voltage because a high electric field is exerted as described above. On the other hand, the organic EL device can be driven at a low voltage of approximately 5 to 20 V.

In the organic EL device, a light emitting device emitting light in a suitable color can be obtained by selecting a fluorescent material which is a luminescent material. It is expected that the organic EL device can be also utilized as a multi-color or full-color display device or the like. Further, it is also considered that the organic EL device is utilized as a backlight of a liquid crystal display device or the like because it can surface-emit light at a low voltage.

In recent years, various studies have been undertaken on such an organic EL device. Developed examples of the organic EL device include ones having a three-layer structure which is referred to as a DH structure in which a hole transporting layer, a luminescent layer and an electron transporting layer are laminated between a hole injection electrode and an electron injection electrode, a two-layer structure which is referred to as an SH-A structure in which a hole transporting layer and a luminescent layer abundant in electron transporting characteristics are laminated between a hole injection electrode and an electron injection electrode, and a two-layer structure which is referred to as an SH-B structure in which a luminescent layer abundant in hole transporting characteristics and an electron transporting layer are laminated between a hole injection electrode and an electron injection electrode.

In the organic EL device, a uniform layer is formed by vacuum evaporation or the like in forming the luminescent layer and the carrier transporting layer. The stability of an organic material in the luminescent layer and the carrier transporting layer is not sufficient, and the organic material is gradually crystallized so that its crystals are deposited on the luminescent layer and the carrier transporting layer with lapse of time. As a result, a short circuit, for example, occurs in the organic EL device, whereby it is impossible to obtain light having uniform and sufficient luminance in the entire organic EL device.

When the organic EL device is utilized as a backlight of a liquid crystal display device or the like, white light emission is required in that the display is easy to see, for example. However, the organic EL device conventionally utilized generally emits light in various colors.

In recent years, in order to obtain white light emission by the organic EL device, a method of doping three types of luminescent materials emitting light in the three primary colors, red (R), green (G) and blue (B) into a host material and uniformly emitting light in red, light in green and light in blue to obtain white light emission [J. Kido, K. Hongawa, K. Okuyama, and K. Nagai; Appl. Phys. Lett. 64 (1994) 815], and a method of laminating three types of luminescent layers using three types of luminescent materials emitting light in the three primary colors, red (R), green (G) and blue (B) and uniformly light in red, light in green and light in blue from the respective luminescent layers to obtain white light emission [Sato, Extended Abstracts (The 55th Autumn Meeting, 19p-H-7, 1994) The Japan Society of Applied Physics] have been proposed.

In either one of the above-mentioned methods, however, light in red, light in green and light in blue must be uniformly emitted. In order to make such an adjustment that the emission intensities are uniform, the amount of each of the luminescent materials doped into the host material, the thickness of each of luminescent layers, and the like must be strictly controlled. Therefore, the fabrication of the organic EL device is very difficult, whereby it is very difficult to obtain constant white light emission. For example, emitted white light is tinged with a certain type of color.

When the above-mentioned organic EL device is utilized as a multi-color or full-color display device, tris (8-hydroxyquinolinate) aluminum (hereinafter abbreviated as $Alq_3$) indicated by the following chemical formula 1, for example, has been conventionally generally utilized as an organic luminescent material in obtaining light emission in green which is one of the three primary colors R, G and B.

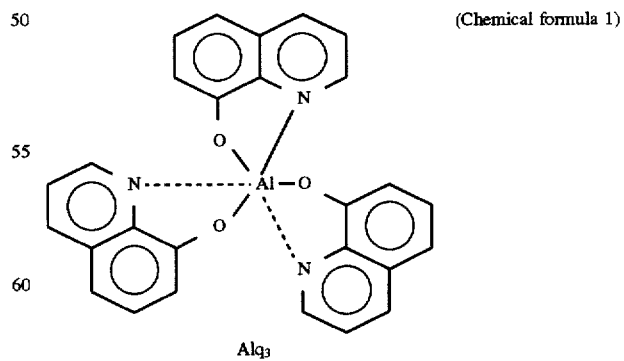

(Chemical formula 1)

$Alq_3$

However, the melting point of $Alq_3$ is as high as 412° C., and $Alq_3$ does not easily sublime. When a luminescent layer is formed by vacuum evaporation or the like, as described above, $Alq_3$ must be heated to approximately 300° C. by resistive heating or the like, whereby a large amount of energy is required to form the luminescent layer. Therefore, the cost of the organic EL device is high, and the productivity thereof is reduced. Since the temperature of $Alq_3$ is increased in forming the luminescent layer, as described above, an organic material in a carrier transporting layer formed prior to the luminescent layer is degraded.

SUMMARY OF THE INVENTION

A first object of the present invention is to provide, in an organic EL device in which a luminescent layer and a carrier transporting layer using an organic material are formed between a hole injection electrode and an electron injection electrode, an organic EL device capable of emitting light having uniform and sufficient luminance for a long time period by preventing an organic material used for a luminescent layer and a carrier transporting layer from being gradually crystallized with lapse of time to deposit crystals on the luminescent layer and the carrier transporting layer.

Another object of the present invention is to provide an organic EL device, in which constant and good white light emission is simply obtained when it is utilized as a backlight of a liquid crystal display device or the like.

Still another object of the present invention is to provide an organic EL device, in which a luminescent layer emitting light in green can be formed simply and at low cost without degrading an organic material in a carrier transporting layer formed prior to the luminescent layer when it is utilized as a multi-color or full-color display device.

In a first organic EL device according to the present invention, in which at least a carrier transporting layer and a luminescent layer using an organic material are laminated between a hole injection electrode and an electron injection electrode, a chelate compound, indicated by the following chemical formula 2, having as a ligand a heterocyclic compound, is contained in at least one of the carrier transporting layer and the luminescent layer.

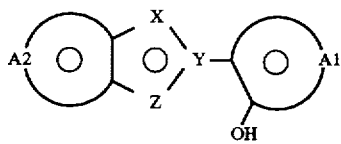

In the foregoing chemical formula 2, X and Z are any elements selected from C, S, Se, Te, N and P, Y is any one element selecting from C, N and P. (A1) is a aromatic radical or a heterocyclic radical in which a hydroxyl group is bound to the Y in an ortho position, and (A2) is a radical which is bound to carbon to which the X is bound and carbon to which the Z is bound to constitute an aromatic compound or a heterocyclic compound.

As a central metal in the chelate compound indicated by the foregoing chemical formula 2, a metal in Group II of a periodic table and preferably, zinc or beryllium is used.

When the chelate compound, indicated by the foregoing chemical formula 2, having as a ligand a heterocyclic compound is used for the carrier transporting layer and the luminescent layer as in the organic EL device, the chelate compound is generally difficult to crystallize. Therefore, there is no possibility that crystals are gradually deposited in the luminescent layer and the carrier transporting layer so that a short circuit, for example, occurs as in the conventional organic EL device, whereby it is possible to stably emit light having uniform and sufficient luminance over a long time period.

In a second organic electroluminescent device according to the present invention, in which at least a luminescent layer containing an organic luminescent material is provided between a hole injection electrode and an electron injection electrode, the luminescent peak wavelength of the organic luminescent material contained in the luminescent layer is in the range of 450 to 570 nm, and the half-width of its emission spectrum is in the range of 100 to 200 nm.

If the organic luminescent material which has a luminescent peak wavelength in the range of 450 to 570 nm and whose emission spectrum has a half-width in the range of 100 to 200 nm is contained in the luminescent layer as in the second organic EL device, white light emission in a constant state is obtained from the luminescent layer. Therefore, there are no such difficulties that three types of luminescent materials emitting light in the three primary colors, red (R), green (G) and blue (B) are doped into a host material to uniformly emit light in red, light in green and light in blue, and three types of luminescent layers using three types of luminescent materials emitting light in the three primary colors, red (R), green (G) and blue (B) are laminated to uniformly emit light in red, light in green and light in blue from the respective luminescent layers as in the conventional organic EL device emitting white light, whereby it is possible to simply perform white light emission in a constant state.

In the second organic EL device, an organic luminescent material which has a luminescent peak wavelength of approximately 520 nm and whose emission spectrum has a half-width of approximately 150 nm is preferably contained.

As such an organic luminescent material, it is preferable to use a chelate compound which is included in a chelate compound, indicated by the chemical formula 2, having as a ligand a heterocyclic compound and has as a ligand 2-(2-hydroxyphenyl) benzothiazole indicated by the following chemical formula 3 or its derivative. $R_1$ and $R_2$ in the following chemical formula 3 may be groups which are bound to a benzene ring to form a polycyclic aromatic compound in addition of substituting groups. It is preferable to use zinc or beryllium as a central metal in the chelate compound.

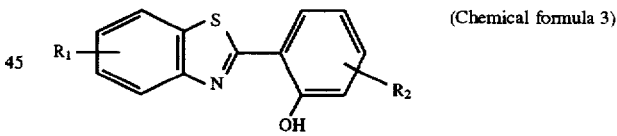

(Chemical formula 3)

In a third organic EL device according to the present invention, in providing at least a luminescent layer containing an organic luminescent material between a hole injection electrode and an electron injection electrode, 2-(2-hydroxyphenyl) benzothiazole indicated by the foregoing chemical formula 3 or its derivative is used as the organic luminescent material.

When 2-(2-hydroxyphenyl) benzothiazole or its derivative is used as the organic luminescent material in the luminescent layer as in the organic EL device, the melting point thereof is generally lower than that of the $Alq_3$. For example, the melting point of 2-(2-hydroxyphenyl) benzothiazole is as low as 129° C., and 2-(2-hydroxyphenyl) benzothiazole sublimes more easily than the conventional $Alql_3$. When the luminescent layer is formed by vacuum evaporation, therefore, 2-(2-hydroxyphenyl) benzothiazole need not be heated to approximately 300° C. by resistive heating or the like, unlike the conventional $Alq_3$, that is, it may be heated to approximately 100° C., whereby energy required to form the luminescent layer may be small. Therefore, the fabrication cost of the organic EL device is reduced, and the productivity thereof is improved. Further, another organic material used for the carrier transporting layer or the like is hardly degraded by heating in forming the luminescent layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Description is now made of preferred embodiments of first to third organic EL devices in the present invention.

Figure 1:
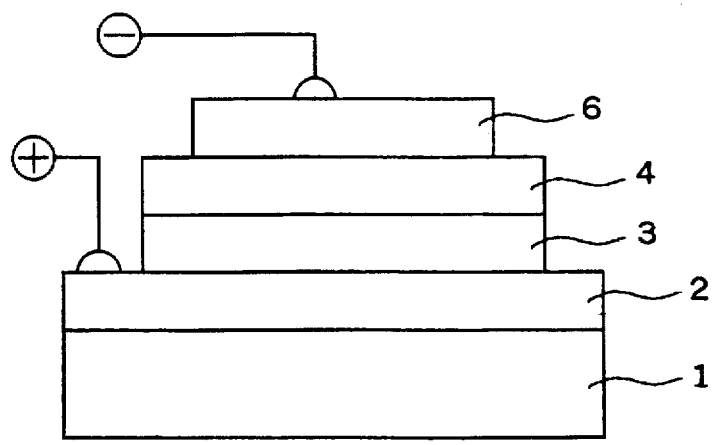
FIG. 1 is a schematic illustration showing an organic EL device according to an embodiment of the present invention, which has an SH-A structure in which a hole transporting layer and a luminescent layer are laminated between a hole injection electrode and an electron injection electrode.
Figure 2:
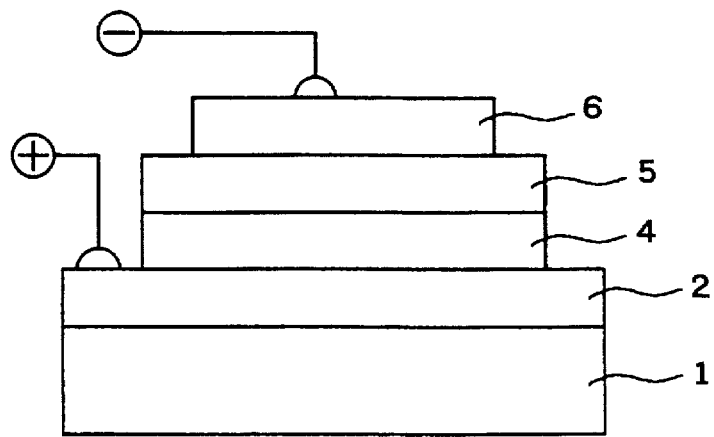
FIG. 2 is a schematic illustration showing an organic EL device according to an embodiment of the present invention, which has an SH-B structure in which a luminescent layer and an electron transporting layer are laminated between a hole injection electrode and an electron injection electrode.
Figure 3:
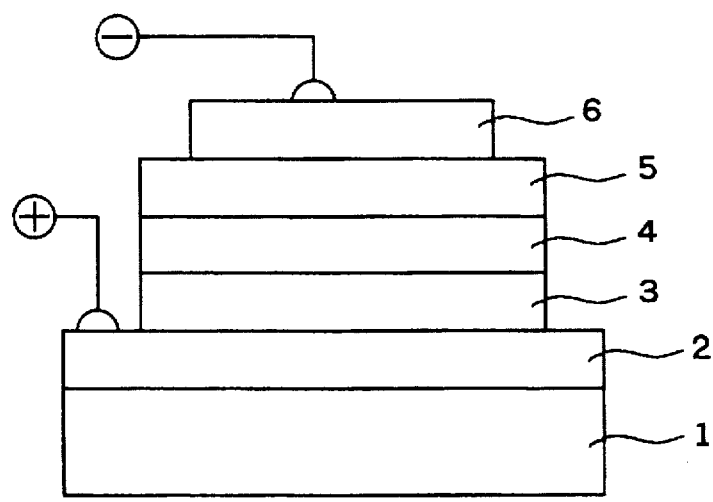
FIG. 3 is a schematic illustration showing an organic EL device according to an embodiment of the present invention, which has a DH structure in which a hole transporting layer, a luminescent layer, and an electron transporting layer are laminated between a hole injection electrode and an electron injection electrode.

Each of the organic EL devices may have any one of an SH-A structure in which a hole transporting layer 3 and a luminescent layer 4 are laminated between a hole injection electrode 2 and an electron injection electrode 6, as shown in FIG. 1, an SH-B structure in which a luminescent layer 4 and an electron transporting layer 5 are laminated between a hole injection electrode 2 and an electron injection electrode 6, as shown in FIG. 2, and a DH structure in which a hole transporting layer 3, a luminescent layer 4, and an electron transporting layer 5 are laminated between a hole injection electrode 2 and an electron injection electrode 6, as shown in FIG. 3.

Furthermore, in each of the above-mentioned organic EL devices, a material having a large work function such as gold or an indium tin oxide (hereinafter referred to as ITO) is used for the hole injection electrode 2, while an electrode material having a small work function such as magnesium is used for the electron injection electrode 6. In order to take out light emitted in the luminescent layer 4, at least one of the electrodes must be made transparent. Generally, transparent ITO having a large work function is used for the hole injection electrode 2.

Furthermore, in the above-mentioned first organic EL device, a chelate compound having a structure indicated by the following chemical formula 4 exists as the chelate compound, indicated by the foregoing chemical formula 2, having as a ligand a heterocyclic compound which is contained in at least one of the carrier transporting layer and the luminescent layer.

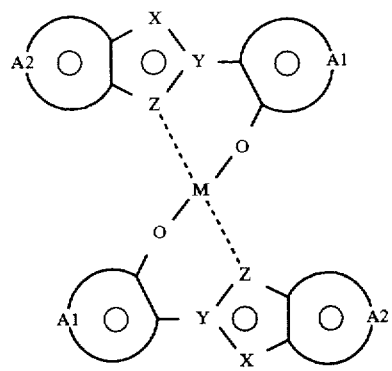

In the foregoing chemical formulas 2 and 4, as (A1) which is an aromatic radical or a heterocyclic radical in which a hydroxyl group is bound to Y in an ortho position, a radical of a heterocyclic compound such as pyrimidine, triazine, phenazine, or carbazole in which a hydroxyl group is bound to Y in an ortho position is used in addition to radicals indicated by the following chemical formulas 5 to 21.

(Chemical formulas 5 to 21)

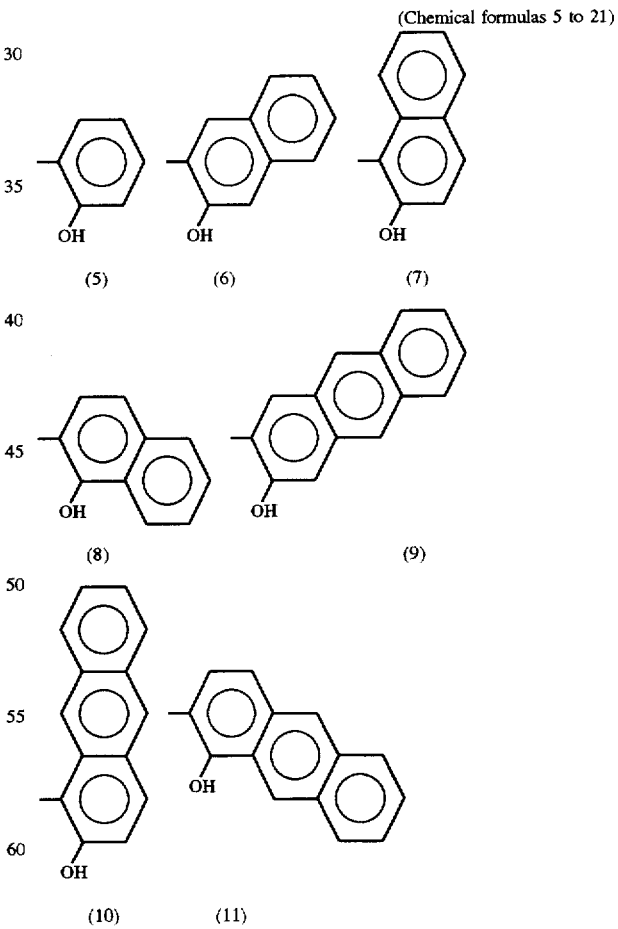

-continued

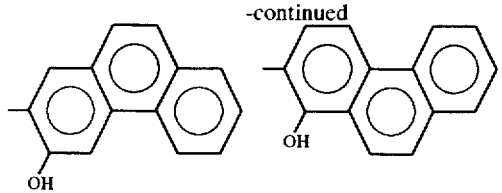

(12)  (13)

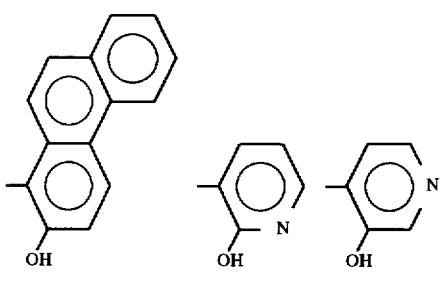

(14)  (15)  (16)

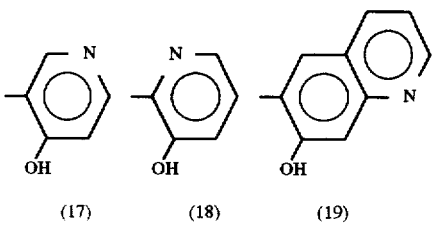

(17)  (18)  (19)

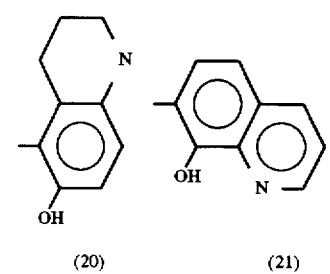

(20)  (21)

In the foregoing chemical formulas 2 and 4, as (A2) which is bound to carbon to which X is bound and carbon to which Z is bound to constitute an aromatic compound or a heterocyclic compound, a radical which is bound to carbon to which X is bound and carbon to which Z is bound to constitute a heterocyclic compound such as pyrimidine, triazine, phenazine, or carbazole is used in addition to radicals indicated the following chemical formulas 22 to 34.

(Chemical formulas 22 to 34)

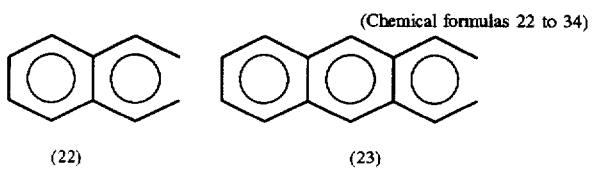

(22)  (23)

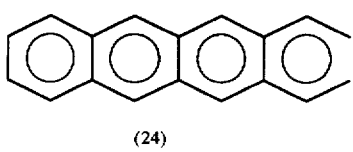

(24)

-continued

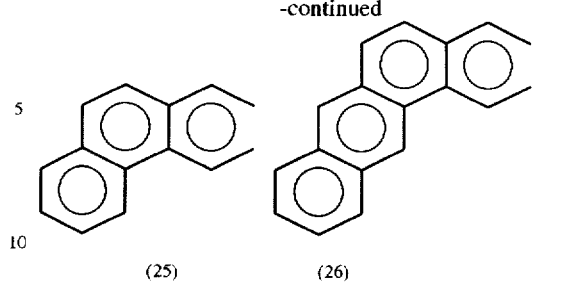

(25)  (26)

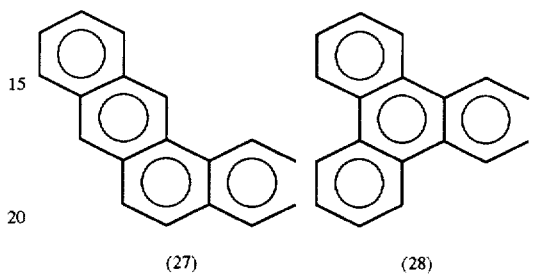

(27)  (28)

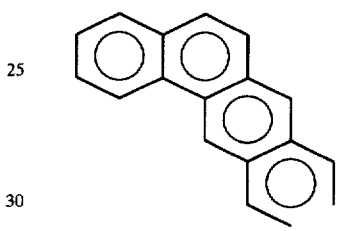

(29)

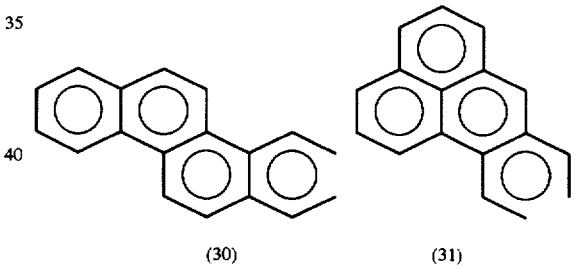

(30)  (31)

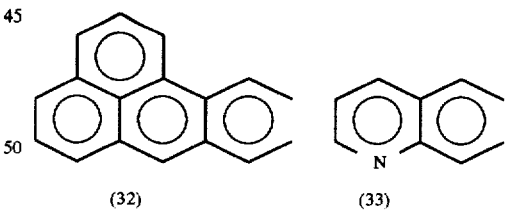

(32)  (33)

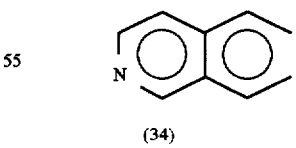

(34)

Furthermore, a substituting group may be bound to the above-mentioned (A1) and (A2). The following are examples of the substituting group bound thereto: $(C_nH_{2n+1})$, $-N(C_nH_{2n+1})_2$, $-F$, $-Cl$, $-Br$, $-I$, $-O(C_nH_{2n+1})$, $-COO(C_nH_{2n+1})$, $-NO_2$, $-CN$, and a phenyl group. Each n in the above-mentioned substituting groups is 0 to 10.

The organic EL device according to the present invention will be described by taking more specific examples.

(EXAMPLE 1)

In an organic EL device in this example 1, a chelate compound indicated by the following chemical formula 36 which is constructed by coordinating two NBTZ indicated by the following chemical formula 35 in zinc (hereinafter referred to as ZnNBTZ) was used as a luminescent material used for a luminescent layer 4.

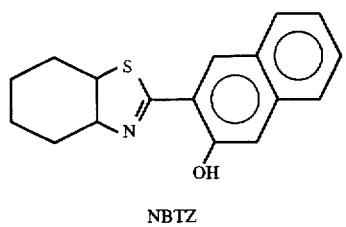

(Chemical formula 35)

NBTZ

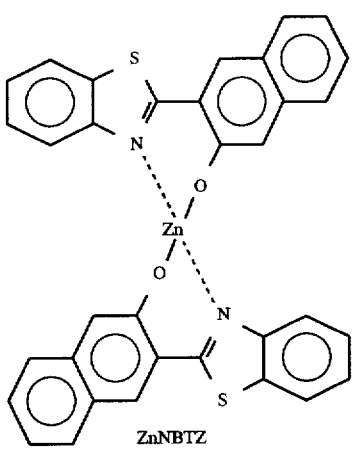

(Chemical formula 36)

ZnNBTZ

In synthesizing the above-mentioned ZnNBTZ, 0.8 g (2.88 mmol) of the above-mentioned NBTZ and 40 ml of methanol which is a solvent were put in a 200 ml eggplant type flask, and 0.32 g (1.44 mmol) of 2 hydrate of zinc acetate was added thereto, after which a cooling pipe was mounted on the flask, to reflux an obtained mixture for six hours. An obtained deposit was filtered and dried, and the filtered and dried deposit was then purified by a sublimating and purifying apparatus using a train sublimation method [H. J. Wagner, R. O. Loutfy, and C. K. Hsiao; J. Mater. Sci. Vol. 17, P2781 (1982)], to obtain the ZnNBTZ. The luminescent peak wavelength of the ZnNBTZ was 594 nm, and the half-width of its emission spectrum was 114 nm.

In this example 1, a transparent hole injection electrode 2 composed of ITO and having a thickness of 2000 Å was formed on a glass substrate 1, and a hole transporting layer 3 composed of N,N'-diphenyl-N,N'-bis(3-methylphenyl)-1, 1'-biphenyl-4,4'-diamine (hereinafter referred to as TPD) indicated by the following chemical formula 37 and having a thickness of 500 Å, a luminescent layer 4 composed of the ZnNBTZ synthesized in the above-mentioned manner and having a thickness of 500 Å, and an electron injection electrode 6 composed of a magnesium-indium alloy and having a thickness of 2000 Å were successively formed on the hole injection electrode 2, as shown in FIG. 1, to obtain an organic EL device having an SH-A structure.

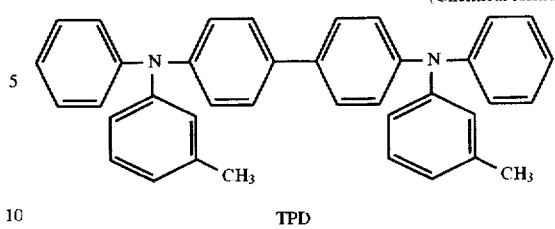

(Chemical formula 37)

TPD

A method of fabricating the organic EL device in this example will be specifically described. A glass substrate 1 on which a hole injection electrode 2 composed of ITO is formed was first cleaned by a neutral detergent, and was then ultrasonically cleaned, respectively, in acetone for twenty minutes and in ethanol for twenty minutes. The glass substrate 1 was further put in boiled ethanol for approximately one minute and was taken out, after which the glass substrate 1 was immediately dried by ventilation.

The above-mentioned TPD was then vacuum evaporated on the hole injection electrode 2 formed on the glass substrate 1, to form a hole transporting layer 3, after which the above-mentioned ZnNBTZ was vacuum evaporated on the hole transporting layer 3, to form a luminescent layer 4. A magnesium-indium alloy was further vacuum evaporated on the luminescent layer 4, to form an electron injection electrode 6. The vacuum evaporation was performed without controlling the substrate temperature at a degree of vacuum of $1 \times 10^{-6}$ Torr.

When a positive voltage and a negative voltage were respectively applied to the hole injection electrode 2 and the electron injection electrode 6 in the organic EL device in this example, high-luminance orange light having the maximum luminance of 1800 cd/m$^2$ and having a luminescent peak wavelength of 592 nm was emitted by the ZnNBTZ at a voltage of 16 V.

In a case where the organic EL device in this example was sealed and was left as it is under room temperature, good light emission was obtained upon application of a voltage even after lapse of one month. Upon observing the organic EL device by a microscope, no crystals were deposited.

(EXAMPLE 2)

In an organic EL device in this example 2, a chelate compound indicated by the following chemical formula 39 which is constructed by coordinating two tOc-BTAZ indicated by the following chemical formula 38 in zinc (hereinafter referred to as Zn(tOc-BTAZ)) was used as a luminescent material used for a luminescent layer 4.

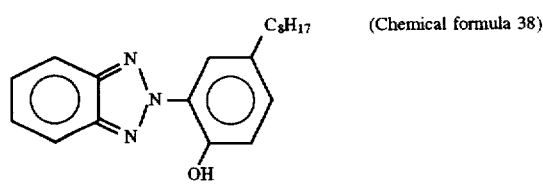

(Chemical formula 38)

tOc-BTAZ

-continued

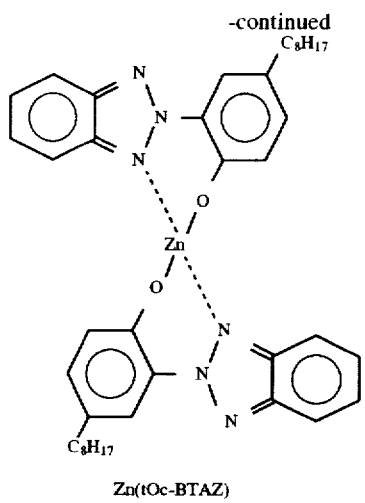

Zn(tOc-BTAZ)   (Chemical formula 39)

In synthesizing the above-mentioned Zn(tOc-BTAZ), 3.0 g (9.28 mmol) of the above-mentioned tOc-BTAZ and 40 ml of methanol which is a solvent were put in a 200 ml eggplant type flask, and 1.02 g (4.64 mmol) of 2 hydrate of zinc acetate was added thereto, after which a cooling pipe was mounted on the flask, to reflux an obtained mixture for six hours. An obtained deposit was filtered and dried, and the filtered and dried deposit was then purified using the above-mentioned sublimating and purifying apparatus, to obtain the Zn(tOc-BTAZ).

In this example 2, a transparent hole injection electrode 2 composed of ITO and having a thickness of 2000 Å was formed on a glass substrate 1, and a luminescent layer 4 composed of the Zn(tOc-BTAZ) synthesized in the above-mentioned manner and having a thickness of 500 Å, an electron transporting layer 5 composed of an oxadiazole derivative (hereinafter referred to as OXD-7) indicated by the following chemical formula 40 and having a thickness of 500 Å, and an electron injection electrode 6 composed of a magnesium-indium alloy and having a thickness of 2000 Å were successively formed on the hole injection electrode 2, as shown in FIG. 2, to obtain an organic EL device having an SH-B structure.

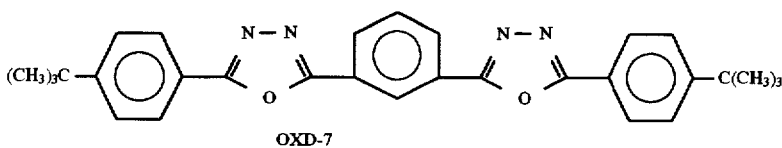

OXD-7   (Chemical formula 40)

When a positive voltage and a negative voltage were respectively applied to the hole injection electrode 2 and the electron injection electrode 6 in the organic EL device in this example, green light having the maximum luminance of 144 cd/m$^2$ was emitted by the Zn(tOc-BTAZ) at a voltage of 25 V. The chromaticity of the green light is X=0.311 and Y=0.583.

In a case where the organic EL device in this example was sealed and was left as it is under room temperature, good light emission was obtained upon application of a voltage even after lapse of three weeks. Upon observing the organic EL device by a microscope, no crystals were deposited.

(EXAMPLE 3)

In an organic EL device in this example 3, a chelate compound indicated by the following chemical formula 42 which is constructed by coordinating two BTZ indicated by the following chemical formula 41 in zinc (hereinafter referred to as ZnBTZ) was used as a luminescent material used for an electron transporting layer 5.

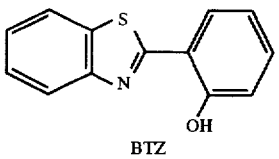

BTZ   (Chemical formula 41)

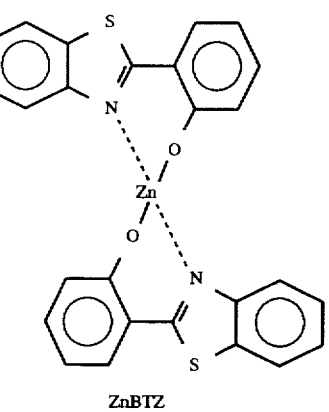

ZnBTZ   (Chemical formula 42)

In synthesizing the above-mentioned ZnBTZ, 2 g (8.80 mmol) of the above-mentioned BTZ and 30 ml of methanol which is a solvent were put in a 200 ml eggplant type flask, and 0.97 g (4.40 mmol) of 2 hydrate of zinc acetate was added thereto, after which a cooling pipe was mounted on the flask, to reflux an obtained mixture for six hours. An obtained deposit was filtered and dried, and the filtered and dried deposit was then purified using the above-mentioned sublimating and purifying apparatus, to obtain the ZnBTZ.

In this example 3, a transparent hole injection electrode 2 composed of ITO and having a thickness of 2000 Å was formed on a glass substrate 1, and a hole transporting layer 3 composed of a triphenylamine derivative (hereinafter referred to as MTDATA) indicated by the following chemical formula 43 and having a thickness of 400 Å, a luminescent layer 4 having a thickness of 400 Å in which 5% by weight of rubrene indicated by the following chemical formula 44 is doped into a host material composed of the TPD indicated by the foregoing chemical formula 37, an electron transporting layer 5 composed of the ZnBTZ synthesized in the above-mentioned manner and having a thickness of 400 Å, and an electron injection electrode 6 composed of a magnesium-indium alloy and having a thickness of 2000 Å were successively formed on the hole injection electrode 2, as shown in FIG. 3, to obtain an organic EL device having a DH structure.

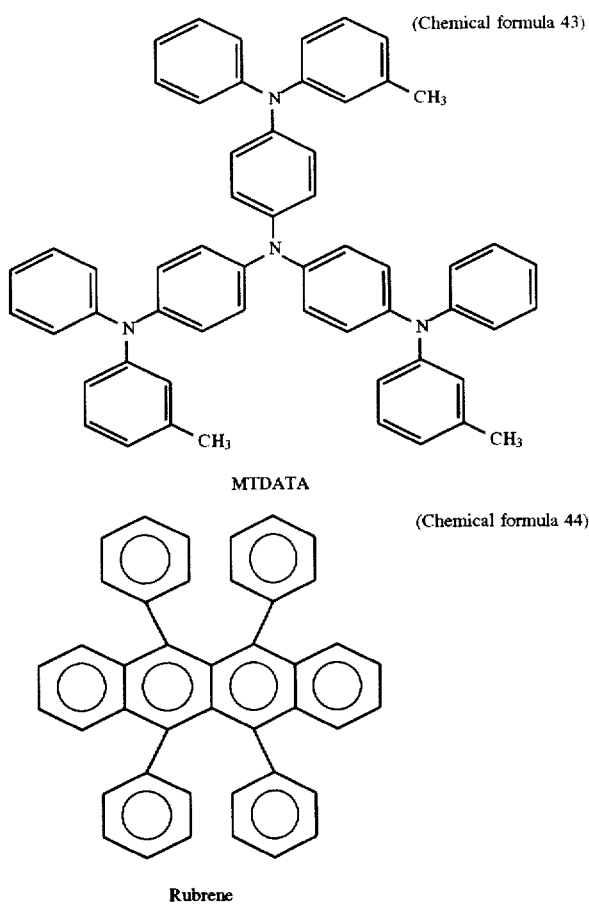

MTDATA

Rubrene

When a positive voltage and a negative voltage were respectively applied to the hole injection electrode 2 and the electron injection electrode 6 in the organic EL device in this example, high-luminance yellow light having the maximum luminance of 76000 cd/m$^2$ and having a luminescent peak wavelength of 562 nm was emitted by the rubrene at a voltage of 15 V.

In a case where the organic EL device in this example was sealed and was left as it is under room temperature, good light emission was obtained upon application of a voltage even after an elapse of three months. Upon observing the organic EL device by a microscope, no crystals were deposited.

(COMPARATIVE EXAMPLE 1)

In an organic EL device in this comparative example 1, only the material composing the electron transporting layer 5 in the above-mentioned organic EL device in the example 3 was changed. In this comparative example, an electron transporting layer 5 having a thickness of 400 Å was formed using an oxadiazole derivative (hereinafter referred to as tBu-PBD) indicated by the following chemical formula 45.

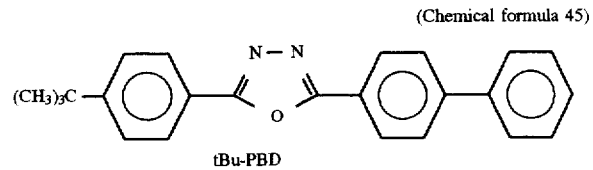

tBu-PBD

When a positive voltage and a negative voltage were respectively applied to a hole injection electrode 2 and an electron injection electrode 6 in the organic EL device in this comparative example, yellow light having the maximum luminance of 8000 cd/m$^2$ and having a luminescent peak wavelength of 562 nm was emitted by rubrene at a voltage of 14 V. In a case where the organic EL device in this comparative example was sealed and was left as it is under room temperature, however, the above-mentioned light emission was not obtained. Upon observing the organic EL device by a microscope, crystals were deposited, so that the organic EL device was destroyed.

(EXAMPLE 4)

In an organic EL device in this example 4, the ZnBTZ indicated by the chemical formula 42 synthesized in the above-mentioned example 3 was used as a luminescent material used for a luminescent layer 4. The luminescent peak wavelength of the ZnBTZ was 524 nm, and the half-width thereof was 150 nm.

In this example 4, a transparent hole injection electrode 2 composed of ITO and having a thickness of 2000 Å was formed on a glass substrate 1, and a hole transporting layer 3 composed of the TPD indicated by the foregoing chemical formula 37 and having a thickness of 500 Å, a luminescent layer 4 composed of the above-mentioned ZnBTZ and having a thickness of 500 Å, and an electron injection electrode 6 composed of a magnesium-indium alloy and having a thickness of 2000 Å were successively formed on the hole injection electrode 2, as shown in FIG. 1, to obtain an organic EL device having an SH-A structure.

When a positive voltage and a negative voltage were respectively applied to the hole injection electrode 2 and the electron injection electrode 6 in the organic EL device in this example, high-luminance white light having the maximum luminance of 10190 cd/m$^2$ was emitted at a voltage of 8 V.

When the above-mentioned ZnBTZ is thus used as the luminescent material used for the luminescent layer 4, it is not necessary that the amount of doping, the thickness, and the like of each of luminescent materials are so strictly controlled that the emission intensities in the luminescent materials are uniform, as in the conventional organic EL device obtaining white light emission using three types of luminescent materials R, G and B, whereby white light emission is simply obtained by one type of luminescent material.

In this example 4, the organic EL device whose device structure is an SH-A structure was illustrated. If the above-mentioned ZnBTZ is used as the luminescent material used for the luminescent layer 4, however, the same white light emission is simply obtained even in a case where the device structure is the above-mentioned DH structure or SH-B structure.

(EXAMPLE 5)

In an organic EL device in this example 5, the BTZ indicated by the foregoing chemical formula 41 was used as a luminescent material used for a luminescent layer 4.

In this example 5, a transparent hole injection electrode 2 composed of ITO and having a thickness of 1000 Å was formed on a glass substrate 1, and a hole transporting layer 3 composed of the TPD indicated by the foregoing chemical formula 37 and having a thickness of 500 Å, a luminescent layer 4 composed of the above-mentioned BTZ and having a thickness of 500 Å, and an electron injection electrode 6 composed of a magnesium-indium alloy and having a thickness of 2000 Å were successively formed on the hole injection electrode 2, as shown in FIG. 1, to obtain an organic EL device having an SH-A structure.

A method of fabricating the organic EL device in this example will be specifically described. A glass substrate 1 on which a hole injection electrode 2 composed of ITO is formed was first cleaned by a neutral detergent, and was then ultrasonically cleaned, respectively, in acetone for twenty minutes and in ethanol for twenty minutes. The glass substrate 1 was further put in boiled ethanol for approximately one minute and was taken out, after which the glass substrate 1 was immediately dried by ventilation.

The above-mentioned TPD was then vacuum evaporated on the hole injection electrode 2 formed on the glass substrate 1, to form a hole transporting layer 3, after which the above-mentioned BTZ was vacuum evaporated on the hole transporting layer 3, to form a luminescent layer 4. A magnesium-indium alloy was further vacuum evaporated on the luminescent layer 4, to form an electron injection electrode 6. The vacuum evaporation was performed without controlling the substrate temperature at a degree of vacuum of $1\times10^{-6}$ Torr.

When a positive voltage and a negative voltage were respectively applied to the hole injection electrode 2 and the electron injection electrode 6 in the organic EL device in this example 5, green light having the maximum luminance of 100 cd/m² was emitted at a voltage of 11 V.

(EXAMPLE 6)

In an organic EL device in this example 6, only the luminescent layer 4 in the above-mentioned example 5 was changed.

The organic EL device in this example 2 was obtained in the same manner as that in the above-mentioned example 5 except that a bis(10-Hydroxybenzo[h]quinolinate) beryllium (hereinafter referred to as $BeBq_2$) indicated by the following chemical formula 46 was used as a host material in a luminescent layer 4, while the BTZ indicated by the foregoing chemical formula 41 was used as a dopant, to provide a luminescent layer 4 having a thickness of 500 Å in which 5% by weight of the BTZ is contained in the $BeBq_2$ using co-evaporation.

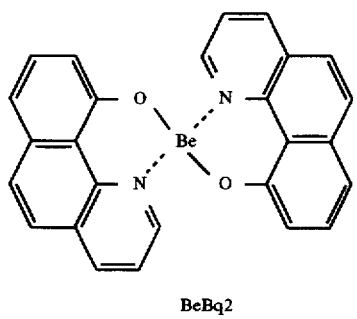

BeBq2

(Chemical formula 46)

When a positive voltage and a negative voltage were respectively applied to a hole injection electrode 2 and an electron injection electrode 6 in the organic EL device in this example 6, green light having the maximum luminance of 2000 cd/m² was emitted at a voltage of 12 V.

In the above-mentioned examples 5 and 6, the organic EL device whose device structure is an SH-A structure was illustrated. If the above-mentioned BTZ is used as the luminescent material used for the luminescent layer 4, however, the same green light emission is obtained even in a case where the device structure is the above-mentioned DH structure or SH-B structure. In a case where the luminescent layer 4 is formed by vacuum evaporation, it is not necessary that the BTZ is heated to approximately 300° by resistive heating or the like, as in a case where the $Alq_3$ is used as an organic luminescent material.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An organic electroluminescent device in which at least a carrier transporting layer and a luminescent layer using an organic material are laminated between a hole injection electrode and an electron injection electrode, wherein a chelate compound, indicated by the following chemical formula, having as a ligand a heterocyclic compound is contained in said carrier transporting layer:

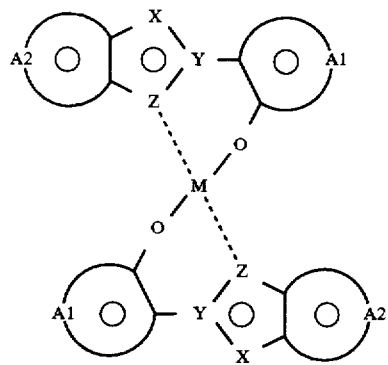

wherein, in the foregoing chemical formula, X and Z are any elements selected from C, S, Se, Te, N and P. Y is any one element selected from C and P. (A1) is an aromatic radical or a heterocyclic radical in which a hydroxyl group is bound to said Y in an ortho position. (A2) is a radical which is bound to carbon to which said X is bound and carbon to which said Z is bound to constitute an aromatic compound or a heterocyclic compound, and a central metal ion M in said chelate compound is a metal ion in Group II of a periodic table.

2. The organic electroluminescent device according to claim 1, wherein the central metal ion M is said chelate compound is zinc or beryllium.

3. An organic electroluminescent device in which at least a luminescent layer containing an organic material is provided between a hole injection electrode and an electron injection electrode, wherein the organic material contained in said luminescent layer is 2-(2-hydroxyphenyl benzothiazole) or its derivative, the organic material not being in the form of a chelate with a metal.

* * * * *